United States Patent
Fukumoto

(10) Patent No.: US 9,437,839 B2
(45) Date of Patent: Sep. 6, 2016

(54) METHOD FOR MANUFACTURING ELECTRONIC DEVICE AND ELECTRONIC DEVICE MANUFACTURED THEREBY

(71) Applicant: Panasonic Intellectual Property Management Co., Ltd., Osaka (JP)

(72) Inventor: Noriaki Fukumoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/727,903

(22) Filed: Jun. 2, 2015

(65) Prior Publication Data

US 2015/0372255 A1    Dec. 24, 2015

(30) Foreign Application Priority Data

Jun. 19, 2014   (JP) .................................. 2014-126382

(51) Int. Cl.
*H01L 51/00* (2006.01)
*H01L 51/52* (2006.01)

(52) U.S. Cl.
CPC ......... *H01L 51/5246* (2013.01); *H01L 51/003* (2013.01); *H01L 51/5253* (2013.01)

(58) Field of Classification Search
CPC .... H01L 51/5246; H01L 51/52; H01L 51/00

USPC ......................................................... 257/40
See application file for complete search history.

(56) References Cited

U.S. PATENT DOCUMENTS

| | | | |
|---|---|---|---|
| 2012/0156480 A1 | 6/2012 | Kondo et al. | |
| 2014/0070203 A1 | 3/2014 | Tanaka et al. | |

FOREIGN PATENT DOCUMENTS

| | | | | |
|---|---|---|---|---|
| JP | 2007-258428 | * | 10/2007 | ............ H01L 31/04 |
| JP | 2009-283155 | * | 12/2009 | ............ H05B 33/10 |
| JP | 2011-046174 | | 3/2011 | |
| JP | 2013-168445 | | 8/2013 | |
| WO | 2013/005254 | | 1/2013 | |

* cited by examiner

*Primary Examiner* — Tuan Nguyen

(74) *Attorney, Agent, or Firm* — Greenblum & Bernstein, P.L.C.

(57) ABSTRACT

On a support substrate, an adhesive layer is formed from a material which decreases an adhesion force thereof to the support substrate when absorbing moisture. In addition, a resin substrate is formed on the adhesive layer, and a sealing layer is formed which seals at least a portion of a laminate structure including the adhesive layer and the resin substrate at which the adhesive layer is exposed. An electronic element is formed above the resin substrate. After a part of a sealing structure including the sealing layer and the support substrate is removed so as to expose the adhesive layer, moisture is supplied to the adhesive layer. An electronic device including the electronic element and the resin substrate is peeled away from the support substrate.

15 Claims, 10 Drawing Sheets

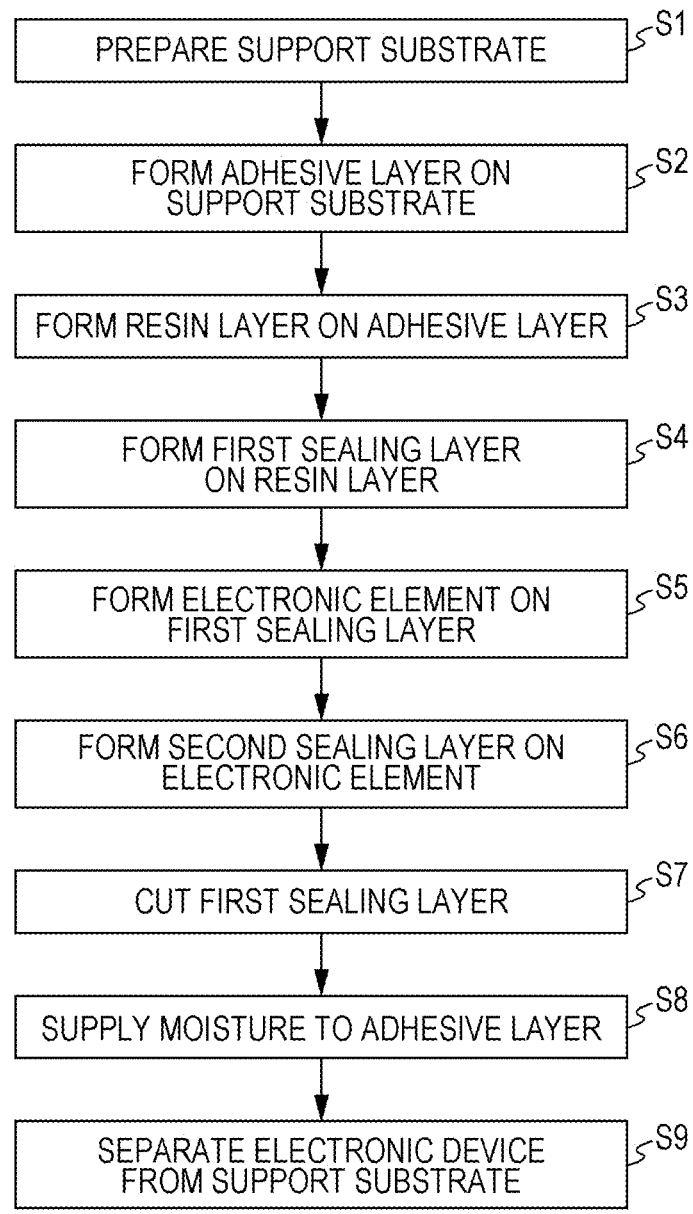

METHOD FOR MANUFACTURING ELECTRONIC DEVICE AND ELECTRONIC DEVICE MANUFACTURED THEREBY

BACKGROUND

1. Technical Field

The present disclosure relates to a method for manufacturing an electronic device including a resin substrate, such as a flexible substrate, and an electronic device formed by the manufacturing method described above.

2. Description of the Related Art

In recent years, since an electronic device which can be curved and which is not likely to be fractured has been increasingly demanded, an electronic device using a resin film as a substrate has been needed. In particular, an electronic device using a flexible substrate as described above is used for a display, a photoelectric conversion element, a radio-frequency (RF) tag, or the like.

A method for manufacturing an electronic device as described above has been classified into three types of methods. That is, there may be mentioned a method (1) in which after a resin substrate is fixed on a hard support substrate, such as a glass substrate, and an electronic element is further formed on the resin substrate, the resin substrate is peeled away from the support substrate; a method (2) in which an electronic element is formed on a resin substrate by direct handling of the resin substrate; and a method (3) in which after an electronic element is formed on a hard glass substrate, the electronic element on the glass substrate is transferred on a resin substrate. In particular, the method (1) is superior to the method (2) in terms of stability in electronic element formation and has an advantage over the method (3) since the electronic element which is formed is not necessary to be transferred. However, by a high-temperature heating step performed in electronic element formation, the adhesion between the support substrate and the resin substrate is increased, and as a result, the problem in that the resin substrate is difficult to be peeled away from the support substrate may arise in some cases.

SUMMARY

In one general aspect, the techniques disclosed here feature a method for manufacturing an electronic device, the method comprising: fixing a resin substrate to a support substrate with an adhesive layer interposed therebetween to form a laminate structure including the adhesive layer and the resin substrate; forming a sealing layer that seals at least a portion of the laminate structure at which the adhesive layer is exposed to form a sealing structure including the sealing layer and the support substrate; forming an electronic element above the resin substrate to form the electronic device including the electronic element and the resin substrate; exposing the adhesive layer by removing a part of the sealing structure; supplying moisture to the adhesive layer; and peeling the electronic device from the support substrate. In this manufacturing method, the adhesive layer contains as a primary component, a material which decreases an adhesion force thereof to the support substrate when absorbing moisture.

According to the manufacturing method described above, when the electronic element is formed, the adhesive layer is covered with the sealing layer and is not in contact with moisture. Hence, the adhesion force between the adhesive layer and the support substrate is not decreased, and the resin substrate is tightly held on the support substrate, so that the state in which the resin substrate is fixed to the support substrate can be maintained. In addition, when the electronic device is peeled away, the exposed adhesive layer absorbs moisture in an ambient atmosphere, and the adhesion force thereof to the support substrate is decreased, so that a peeling stress generated when the resin substrate is peeled away from the support substrate can be decreased. Hence, the resin substrate and the electronic element can be suppressed from being degraded by the peeling stress.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 5 is a flowchart showing a method for manufacturing the electronic device;

DETAILED DESCRIPTION

Figure 1A:
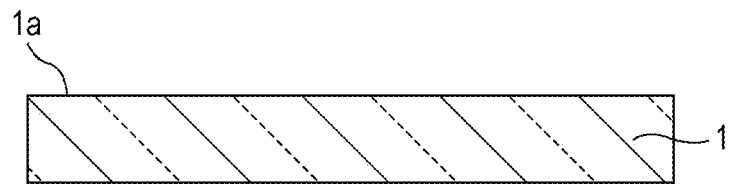
FIG. 1A is a cross-sectional view showing a support substrate.

In a step of forming an electronic element, a bonding force between a resin substrate and a support substrate is preferably high. The reason for this is that when the bonding force is low, for example, the resin substrate may come up from the support substrate, and the state in which the resin substrate is fixed to the support substrate cannot be maintained. However, as disclosed in Japanese Unexamined Patent Application Publication No. 2013-168445, in a step of peeling away an electronic device, the resin substrate is required to be peeled away by a force larger than the bonding force between the resin substrate and the support substrate. Hence, as the bonding force between the resin substrate and the support substrate is increased, a peeling stress is required to be increased, and when the electronic device is peeled away, the resin substrate or the electronic device may be damaged thereby in some cases.

The present disclosure provides a manufacturing method in which a resin substrate is tightly held on a support substrate in a step of forming an electronic element, and after the electronic element is formed, the resin substrate can be easily peeled away from the support substrate.

A method for manufacturing an electronic device according to one aspect of the present disclosure is a method for manufacturing an electronic device, the method comprising: fixing a resin substrate to a support substrate with an adhesive layer interposed therebetween to form a laminate structure including the adhesive layer and the resin substrate; forming a sealing layer that seals at least a portion of the laminate structure at which the adhesive layer is exposed to form a sealing structure including the sealing layer and the support substrate; forming an electronic element above the resin substrate to form the electronic device including the electronic element and the resin substrate; exposing the adhesive layer by removing a part of the sealing structure; supplying moisture to the adhesive layer; and peeling the electronic device from the support substrate. In the manufacturing method described above, the adhesive layer contains as a primary component, a material which decreases an adhesion force thereof to the support substrate when absorbing moisture.

In addition, an electronic device according to one aspect of the present disclosure comprises: a resin substrate including a first surface and a second surface opposite to the first surface; an adhesive layer arranged on the first surface of the resin substrate; a sealing layer arranged on the second surface of the resin substrate, and including a third surface in contact with the resin substrate and a fourth surface opposite to the third surface; an electronic element arranged on the fourth surface of the sealing layer; and an element sealing layer covering the electronic element, and the adhesive layer satisfies in accordance with an ASTM D570 test method, at least one selected from the group of a water absorption rate of 1.5% or more by water immersion at 23° C. for 24 hours and a water absorption rate of 1% or more in an equilibrium state at 50° C. and an a relative humidity (RH) of 60%.

In the manufacturing method described above, when the electronic element is formed, since the adhesive layer is covered with the sealing layer so as not to be in contact with moisture, the adhesion force between the adhesive layer and the support substrate is not decreased, and the resin substrate is tightly held on the support substrate, so that the state in which the resin substrate is fixed to the support substrate can be maintained. On the other hand, when the electronic device is peeled away, since the exposed adhesive layer absorbs moisture in an ambient atmosphere, and the adhesion force thereof to the support substrate is decreased, a peeling stress generated when the resin substrate is peeled away from the support substrate can be decreased. Hence, the resin substrate and the electronic element can be suppressed from being degraded by the peeling stress.

In addition, the part of the sealing structure which is removed may include a part of the adhesive layer located around the electronic element and a part of the resin substrate located around the electronic element.

In addition, a surface of the support substrate may include a hydroxy group, and the water absorption rate of the material of the adhesive layer may be higher than that of a material of the resin substrate. Accordingly, the adhesion force of the adhesive layer to the support substrate can be increased when the adhesive layer contains no water, and in addition, the adhesion force thereof to the support substrate can be decreased when the adhesive layer absorbs moisture.

In addition, the material of the adhesive layer may satisfy in accordance with an ASTM D570 test method, at least one selected from the group of a water absorption rate of 1.5% or more by water immersion at 23° C. for 24 hours and a water absorption rate of 1% or more in an equilibrium state at 50° C. and an RH of 60%. Accordingly, at an interface between the adhesive layer and the support substrate which is not in direct contact with water, the case in which the adhesion force between the adhesive layer and the support substrate is not decreased can be avoided.

In addition, the adhesive layer may contain as the primary component, a polyimide, which includes carbonyl groups, or a poly(imide amide), which includes carbonyl groups.

In addition, as the support substrate, a glass substrate may be used.

In addition, the sealing layer may be formed so as to cover the resin substrate; the electronic element may be formed on the sealing layer; after the electronic element is formed and before the part of the sealing structure is removed, an element covering layer covering the upper surface and the peripheral surface of the electronic element, and adhering to the sealing layer may be formed so as to be present at an inner side of the adhesive layer when viewed in plan; and the part of the sealing structure which is removed may include a portion of the sealing layer present at an outer side of the element covering layer and at an inner side of the adhesive layer when viewed in plan. Accordingly, when the sealing layer is cut out, the element covering layer is no destroyed, and when moisture is brought into contact with the adhesive layer, the electronic element can be prevented from being in contact with moisture.

In addition, the sealing layer may be formed so as to cover the resin substrate; the electronic element may be formed on the sealing layer; after the electronic element is formed and before the part of the sealing structure is removed, an element covering layer covering the upper surface and the peripheral surface of the electronic element, and adhering to the sealing layer may be formed so as to be present at an inner side of the adhesive layer when viewed in plan; the part of the sealing structure which is removed may include a portion of the sealing layer present at an outer side of the electronic element and at an inner side of the adhesive layer when viewed in plan; and furthermore, a portion of the element covering layer present on the portion of the sealing layer which is removed may be removed. Accordingly, when the sealing layer is cut out, the electronic element is prevented from being exposed, and when moisture is brought into contact with the adhesive layer, the electronic element can be prevented from being in contact with moisture.

In addition, the resin substrate may be a porous substrate including a plurality of pores therein; the sealing layer may be formed so as to cover the resin substrate; and the part of the sealing structure which is removed may include a part of the sealing layer covering the resin substrate. Accordingly, through the pores on the resin substrate, moisture can be brought into contact with the adhesive layer which is not exposed.

In addition, the adhesive layer may extend in a peripheral direction of the support substrate than the electronic element, the sealing layer may be formed so as to cover the resin substrate, the part of the sealing structure which is removed may include a portion of the sealing layer present an outer side of the electronic element, and a portion of the adhesive layer present under the portion of the sealing layer which is removed may be removed. Accordingly, a part of the adhesive layer can be exposed simultaneously when the cutting of the resin substrate is performed, and hence the step can be simplified.

In addition, the thickness of the adhesive layer may be smaller than that of the resin substrate. Accordingly, the case in which the flexibility of the resin substrate is lost by the adhesive layer can be avoided.

In addition, the thickness of the adhesive layer may be set to 5 μm or less. Accordingly, the case in which the flexibility of the resin substrate is lost by the adhesive layer can be avoided, and the resin substrate can be peeled away from the support substrate with a small amount of moisture.

In addition, by removing the part of the sealing structure, the adhesive layer may be partially exposed to moisture supplied to the adhesive layer. Accordingly, the electronic element can be prevented from being in contact with moisture, and the surface of the electronic device is prevented from being contaminated with water drops and the like.

In addition, the electronic element may be an organic electroluminescence (EL) element comprising two facing electrodes and an organic functional layer which is located between the two facing electrodes and which includes an organic EL light emitting layer. Hence, according to one aspect of the present disclosure, an organic EL device can be manufactured.

Hereinafter, the embodiments of the present disclosure will be shown with reference to concrete examples, and the configuration, the operation, and the effect thereof will be described.

Incidentally, the following embodiments and modified examples will be describe by way of example for easy understanding of the configuration, the operation, and the effect according to one aspect of the present disclosure, and the present disclosure is not limited at all to the following embodiments and modified examples except for the substantial scope thereof.

Embodiment 1

1. Method for Manufacturing Electronic Device

As for a method for manufacturing an electronic device according to an embodiment 1 of the present disclosure, a method for manufacturing an active matrix type organic EL display device will be described by way of example.

First, as shown in FIG. 1A, a support substrate 1 is prepared (Step S1). The support substrate 1 is used to preferably handle an in-process electronic device (hereinafter referred to as "intermediate electronic device product"), for example, in a process for manufacturing an electronic device. Hence, the support substrate 1 may have a strength so as to carry the intermediate electronic device product. As a material of the support substrate 1, for example, there may be used a glass material, such as non-alkali glass (borosilicate glass), alkali glass, soda glass, non-fluorescent glass, phosphoric acid-based glass, boric acid-based glass, or quartz, or an insulating material, such as alumina.

In order to improve the adhesion to a layer formed on an upper surface 1a of the support substrate 1, the flatness of the upper surface 1a of the support substrate 1 is preferably high. In particular, the surface roughness Rmax is preferably 10 μm or less and more preferably 1 μm or less.

In addition, in order to improve the adhesion to the layer formed on the upper surface 1a of the support substrate 1, the upper surface 1a thereof is preferably placed in a clean state. As a cleaning method to place the upper surface 1a of the support substrate 1 in a clean state, for example, UV light irradiation, ozone treatment, plasma treatment, or fluoric acid treatment may be used.

Figure 1B:
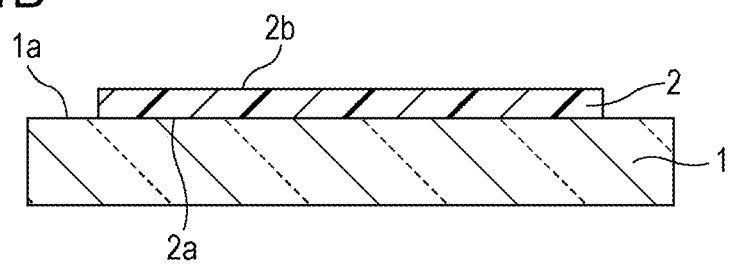
FIG. 1B is a cross-sectional view showing an adhesive layer formed on the support substrate.

Next, as shown in FIG. 1B, an adhesive layer 2 is formed on the upper surface 1a of the support substrate 1 (Step S2). The adhesive layer 2 is provided so as to adhere a resin substrate 3X which will be described later to the support substrate 1. As a material of the adhesive layer 2, a material may be used which decreases an adhesion force thereof to the support substrate when being in contact with moisture. In addition, as long as containing the material as described above as a primary component, the adhesive layer 2 may also contain another material. In this case, the primary component indicates that the content of the material described above is 50% or more and more preferably 80% or more. As the material described above, for example, a polyimide, a poly(imide amide), a polyurea, a polyamide, or a polyaramid may be used. A polyimide, a poly(imide amide), and a polyurea each include many carbonyl groups in its molecular structure. In addition, a polyamide and a polyaramid each have many amide groups in its molecular structure. In addition, among the materials mentioned above, for example, a material which satisfies at least one of the following two conditions is preferably used. Accordingly, even if a lower surface 2a of the adhesive layer 2 in contact with the upper surface 1a of the support substrate 1 is not in direct contact with moisture, when any one of the surfaces of the adhesive layer 2 is in contact with moisture, the adhesive layer 2 contains moisture, and as a result, an effect of decreasing the adhesion force between the upper surface 1a of the support substrate 1 and the lower surface 2a of the adhesive layer 2 can be obtained.

(1) In an ASTM D570 test method, the water absorption rate is 1.5% or more by water immersion at 23° C. for 24 hours.

(2) In an ASTM D570 test method, the water absorption rate is 1% or more in an equilibrium state at 50° C. and an RH of 60%.

The adhesive layer 2 preferably has a thickness so as to be uniformly adhered to the support substrate 1. In particular, a thickness of 1 nm or more is preferable. On the other hand, as shown below, the adhesive layer 2 preferably has a small thickness. First, when the resin substrate 3X which will be described later is peeled away from the support substrate 1, an adhesive layer 2 having a small thickness can decrease a stress applied to the resin substrate 3X. Second, when an upper surface 2b of the adhesive layer 2 is exposed, an adhesive layer 2 having a small thickness can enable moisture to efficiently come into contact with the lower surface 2a. For example, the adhesive layer 2 is preferably thinner than the resin substrate 3X. In addition, the thickness of the adhesive layer 2 is preferably 5 μm or less.

Figure 1C:
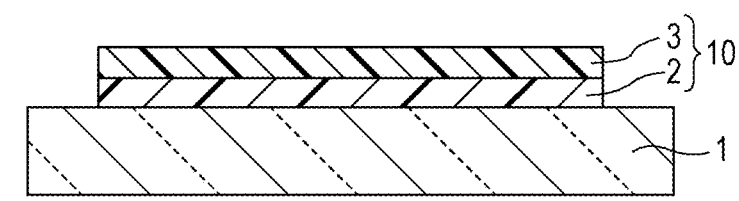
FIG. 1C is a cross-sectional view showing a laminate structure formed on the support substrate.

Next, as shown in FIG. 1C, a resin layer 3 forming the resin substrate 3X of an electronic device is formed on the upper surface 2b of the adhesive layer 2 (Step S3). As a material of the resin layer 3, for example, a polyethylene, a polypropylene, a polyvinylene, a poly(vinylidene chloride), a poly(ethylene terephthalate), a poly(ethylene naphthalate), a polycarbonate, a poly(ethylene sulfonic acid), a silicone, an acrylic resin, an epoxy resin, a phenol resin, a polyamide, a polyimide, or an aramid resin may be used. In addition, at least two types of those materials mentioned above may be used by mixing, and those materials may also be chemically modified.

The resin substrate 3X is preferably not to be fractured nor destroyed when being bended. Hence, the resin layer 3 forming the resin substrate 3X preferably has a thickness in a range of 1 to 1,000 μm. When the thickness is set to 1 μm or more, a mechanical strength can be obtained. In addition, when the thickness is set to 1,000 μm or less, a flexible display device having a high flexibility can be obtained.

As a method for forming the resin layer 3, a liquid resin material may be applied, or a film which is already formed may be pressure bonded. When the film which is already formed is pressure bonded, a sticking layer may be formed between the resin layer 3 and the adhesive layer 2. As the sticking layer, for example, a silicone-based or an acrylic-based layer having a desired sticking force may be used without any particular limitation.

Figure 1D:
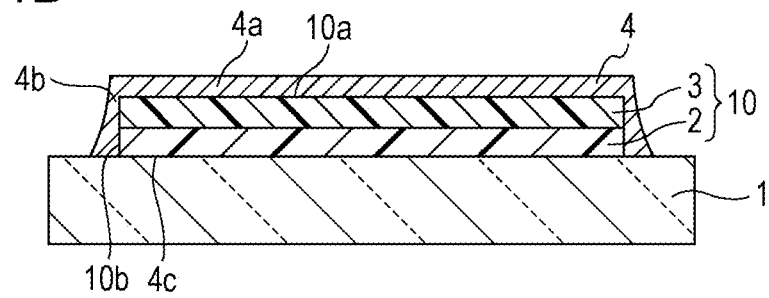
FIG. 1D is a cross-sectional view showing a first sealing layer covering the laminate structure formed on the support substrate.

Next, as shown in FIG. 1D, a first sealing layer 4 covering a laminate structure 10 formed of the adhesive layer 2 and the resin layer 3 is formed (Step S4). The first sealing layer 4 functions as a sealing layer not to expose the adhesive layer 2. As a material of the first sealing layer 4, for example, a known inorganic material, such as silicon nitride, may be used. In addition, for example, there may be used a moisture absorber-containing resin in which a chemical absorber, such as calcium oxide, or a physical absorber, such as zeolite, is dispersed in a resin material. Furthermore, a multilayer structure in which the above inorganic material and the above moisture absorber-containing resin are laminated to each other may also be used.

The first sealing layer 4 is continuously provided from on an upper surface 10a of the laminate structure 10 to on the upper surface 1a of the support substrate 1 along a peripheral surface 10b of the laminate structure 10. That is, the first sealing layer 4 includes a first portion 4a adhering to the upper surface 10a of the laminate structure 10 and a second portion 4b adhering to the peripheral surface 10b of the laminate structure 10, and a lower end 4c of the second portion 4b adheres to the upper surface 1a of the support substrate 1. The first sealing layer 4 and the support substrate 1 collectively form a sealing structure sealing the entire laminate structure 10. Hence, in a step of forming an electronic element 5 which will be described later, the laminate structure 10 is prevented from being in contact with the air, and as a result, the adhesion force between the support substrate 1 and the adhesive layer 2 is prevented from being decreased. In addition, even by a step in which water is used for water washing or the like, the adhesive layer 2 can be prevented from being in contact with moisture. Hence, in the step of forming the electronic element 5, an unintentional decrease in adhesive force between the support substrate 1 and the adhesive layer 2 can be prevented.

Figure 2A:
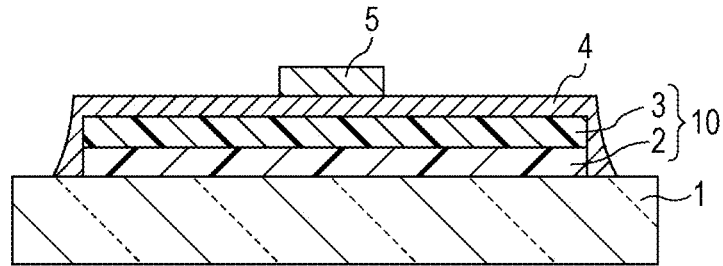
FIG. 2A is a cross-sectional view showing the laminate structure formed on the support substrate and an electronic element further formed on the first sealing layer.

Next, as shown in FIG. 2A, the electronic element 5 is formed on the first sealing layer 4 (Step S5). The electronic element is formed, for example, of an organic EL element which includes a cathode, an anode, and a light emitting layer provided therebetween and a TFT (thin film transistor) driving the organic EL element. The TFT includes a gate insulating film, source/drain electrodes, a bank, a semiconductor layer, a passivation film, and the like. The organic EL element includes a cathode, an anode, and a light emitting layer provided therebetween and may further include an electron injection layer, an electron transport layer, a hole injection layer, a hole transport layer, a partition layer, and the like. The organic EL element may further include a color filter, a protective layer, and/or the like. The TFT may use as a channel material, silicon, an oxide semiconductor, such as indium gallium zinc oxide, or an organic semiconductor, such as pentacene.

Figure 2B:
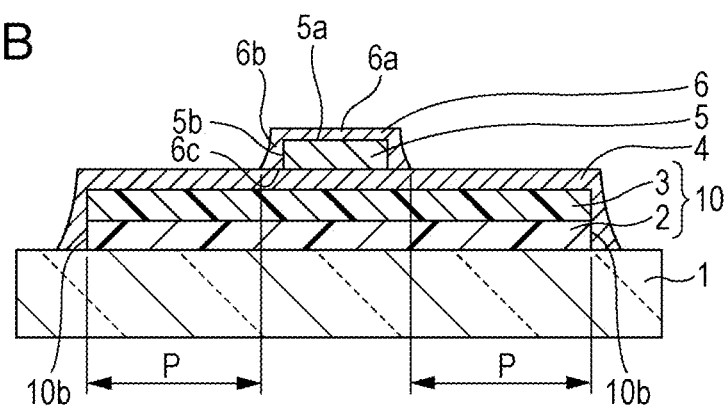
FIG. 2B is a cross-sectional view showing a second sealing layer formed over the electronic element.

Next, as shown in FIG. 2B, a second sealing layer 6 is formed on the electronic element 5 (Step S6). The second sealing layer 6 functions as an element covering layer so as not to expose the electronic element 5. As a material of the second sealing layer 6, for example, a known inorganic material, such as silicon nitride, may be used.

As is the case of the first sealing layer 4, the second sealing layer 6 is continuously provided from on an upper surface 5a of the electronic element 5 to on an upper surface of the first sealing layer 4 along a peripheral surface 5b of the electronic element 5. That is, the second sealing layer 6 includes a first portion 6a adhering to the upper surface 5a of the electronic element 5 and a second portion 6b adhering to the peripheral surface 5b thereof, and an lower end 6c of the second portion 6b adheres to the upper surface of the first sealing layer 4. The first sealing layer 4 and the second sealing layer 6 collectively form an element protection structure which seals the entire electronic element 5. Hence, in a step in which moisture is brought into contact with the adhesive layer 2 which will be described later, the electronic element 5 can be prevented from being in contact with moisture. Accordingly, the electronic element 5 is prevented from being degraded by the contact thereof with moisture. In addition, the lower end 6c of the second portion 6b of the second sealing layer 6 is located at an inner side of the peripheral surface 10b of the laminate structure 10. That is, at the upper side of the laminate structure 10, there is a region P in which the first sealing layer 4 is present but the second sealing layer 6 is not present.

Figure 2C:
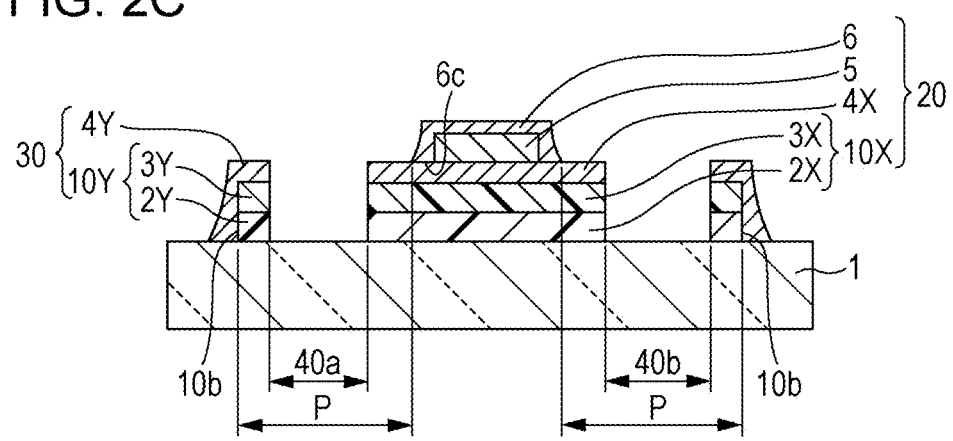
FIG. 2C is a cross-sectional view showing the state in which the laminate structure and the first sealing layer are cut out.
Figure 4A:
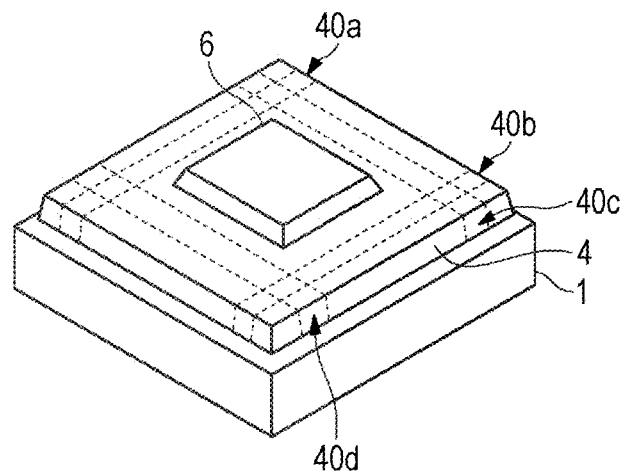
FIG. 4A is an external view showing the state after the second sealing layer is formed.
Figure 4B:
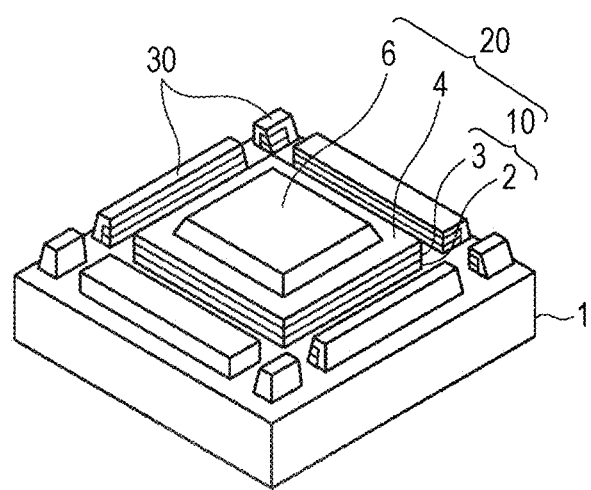
FIG. 4B is an external view showing the state in which the electronic device is formed on the support substrate by cutting.

Next, as shown in FIG. 2C, for example, by the use of a cutter, the first sealing layer 4 and the laminate structure 10 are collectively cut out (Step S7). In this case, cutting positions 40a and 40b are each located at an outer side of the lower end 6c of the second portion 6b of the second sealing layer 6 and is also located at an inner side of the peripheral surface 10b of the laminate structure 10. That is, the cutting positions 40a and 40b are present in the region P described above. The state before the cutting is performed is shown in FIG. 4A, and the state after the cutting is performed is shown in FIG. 4B. The cutting positions 40a, 40b, 40c, and 40d shown in FIG. 4A are present in the region P described above. As shown in FIG. 2C, on the support substrate 1, an electronic device 20 is formed in which a first sealing layer 4X, the electronic element 5, and the second sealing layer 6 are provided on a laminate substrate 10X formed of an adhesive layer 2X and the resin substrate 3X, each of which is obtained by cutting. In addition, at an outer side of the cutting positions, substrate end portions 30 remain each of which includes a first sealing layer piece 4Y and a laminate substrate piece 10Y formed of an adhesive layer piece 2Y and a resin substrate piece 3Y. Since cutting is performed within the region P, the above element protection structure can be maintained. Furthermore, since the laminate structure 10 is cut out so that the upper surface 1a of the support substrate 1 is exposed, a lower end 2c of a peripheral surface 2d of the adhesive layer 2X can be exposed.

Figure 3A:
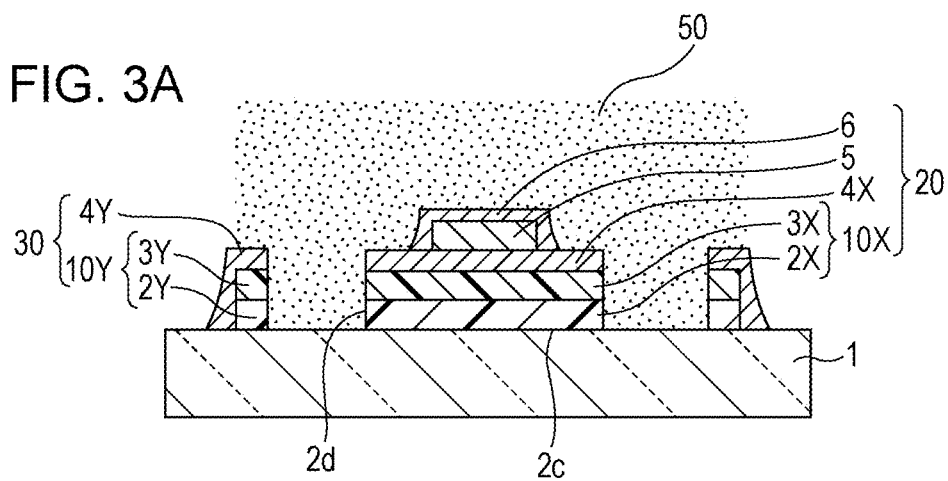
FIG. 3A is a cross-sectional view showing the state in which a laminate substrate obtained by cutting is exposed to water vapor.

Next, as shown in FIG. 3A, a moisture 50 is supplied to the adhesive layer 2X (Step S8). As a method to supply the moisture 50 to the adhesive layer 2X, for example, there may be mentioned a method in which liquid water is brought into contact with the exposed adhesive layer 2X or a method in which the support substrate 1 and the electronic device 20 formed thereon are placed together in a high-humidity atmosphere. In this embodiment, the support substrate 1 and the electronic device 20 formed thereon are placed together in a high-humidity atmosphere, in particular, in an atmosphere at a humidity of 90% or more. As the moisture 50, when gaseous water (water vapor) is used instead of using liquid water, for example, the surface of the electronic device 20 can be made free from remaining traces of water droplets and contamination caused by adhesion of materials used in electronic element formation.

Figure 3B:
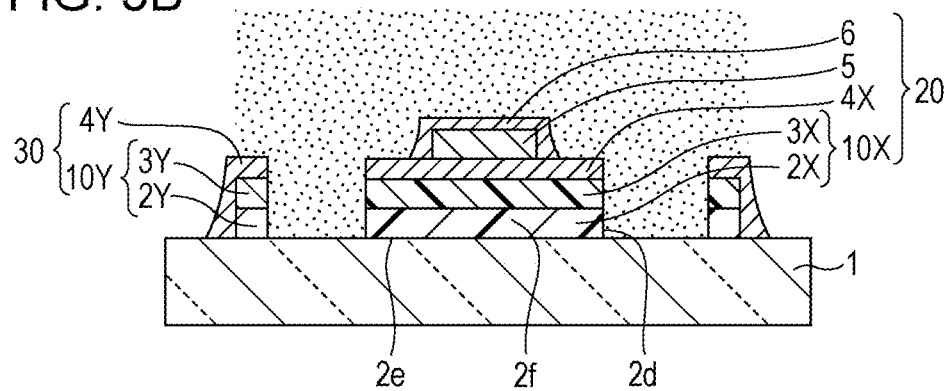
FIG. 3B is a cross-sectional view showing the state in which the laminate substrate exposed to water vapor absorbs moisture.

With reference to FIG. 3B, the manufacturing method of this embodiment will be described in more detail. Since the lower end 2c of the peripheral surface 2d of the adhesive layer 2X is in contact with the moisture 50, from the lower end 2c of the peripheral surface 2d of the adhesive layer 2X, the moisture 50 permeates between the upper surface 1a of the support substrate 1 and a bottom surface 2e of the adhesive layer 2X along the bottom surface 2e thereof. In addition, as described above, since the material of the adhesive layer 2X has a predetermined water absorbability, the moisture 50 which permeates the peripheral surface 2d of the adhesive layer 2X also partially reaches the bottom surface 2e of the adhesive layer 2X through an inside 2f thereof. Hence, as the water absorbability of the material of the adhesive layer 2X is increased, since the inside 2f of the adhesive layer 2X also functions as a permeation path of the moisture 50 besides the bottom surface 2e of the adhesive layer 2X, the moisture 50 more quickly permeates the entire bottom surface 2e of the adhesive layer 2X. When the moisture 50 permeates the entire bottom surface 2e of the adhesive layer 2X, since the adhesion force between the upper surface 1a of the support substrate 1 and the bottom surface 2e of the adhesive layer 2X is decreased, the electronic device 20 is likely to be peeled away from the support substrate 1. In addition, since a water vapor component is contained in the air, when the laminate structure 10 is exposed, the water vapor component in the air is brought into contact with the laminate structure 10, and the adhesion force of the adhesive layer 2 can be decreased.

Figure 3C:
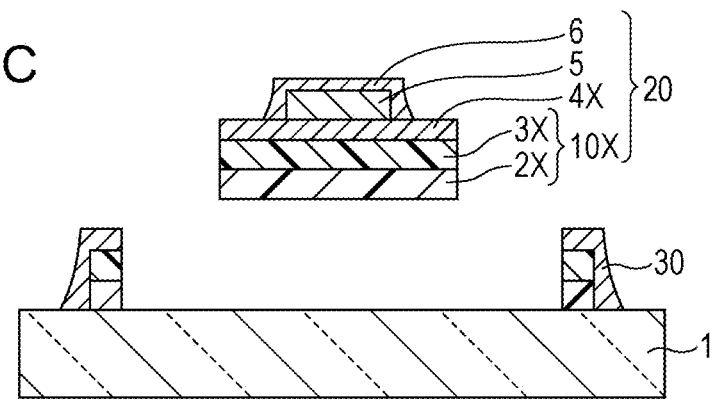
FIG. 3C is a cross-sectional view showing an electronic device peeled away from the support substrate.

Finally, as shown in FIG. 3C, the electronic device 20 is peeled away from the support substrate 1 (Step S9). In particular, for example, the electronic device 20 is absorbed by a pick-up device having an absorption nozzle and is then peeled away from the support substrate 1. Since the adhesive layer 2 is in contact with moisture, the adhesion force thereof to the support substrate 1 is decreased, and the electronic device 20 can be easily peeled away from the support substrate 1.

As has thus been described, by the configuration of the embodiment according to one aspect of the present disclosure, the damage done on the electronic device can be prevented or reduced when the electronic device is peeled away from the support substrate. Furthermore, the separation of the support substrate 1 can be stably and easily carried out.

2. Adhesion Force Between Adhesive Layer and Support Substrate

The adhesion force between the support substrate 1 and the adhesive layer 2 will be described with reference to a concrete example. In this example, the case will be described in which non-alkali glass is used as a material of the support substrate 1 and as a material of the adhesive layer 2, Upilex A manufactured by Ube Industries Ltd., which is one example of a polyimide, is used.

Figure 6A:
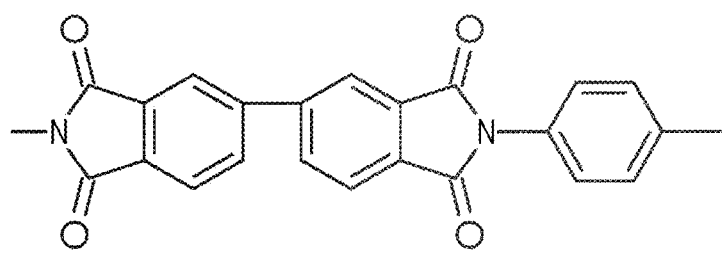
FIG. 6A is a schematic chemical formula of a material contained in the adhesive layer as a primary component.
Figure 6B:
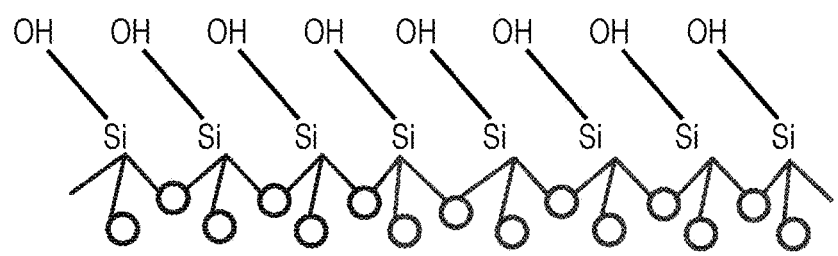
FIG. 6B is a schematic chemical structure showing a surface condition of the support substrate.
Figure 7A:
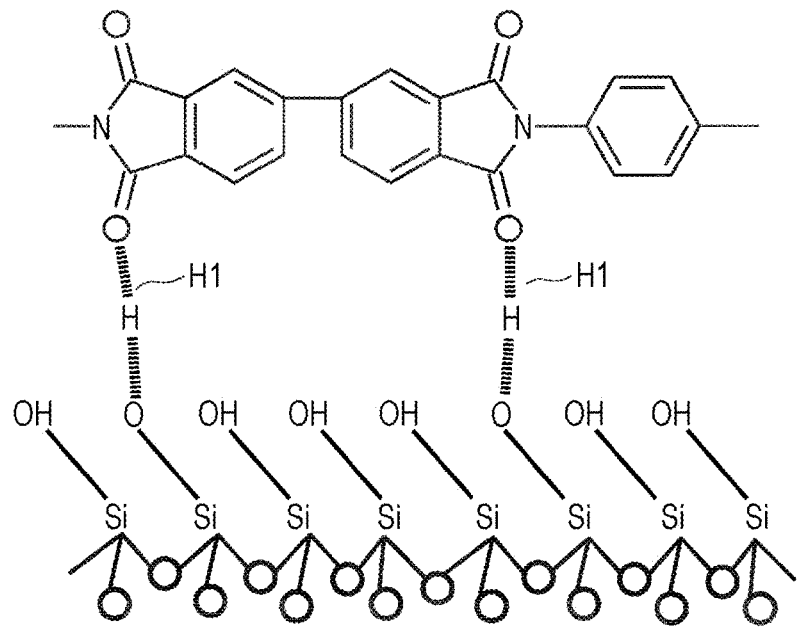
FIG. 7A is a schematic chemical structure showing the state in which the adhesive layer and the support substrate are adhered to each other.

A chemical structure of one repeating unit of Upilex A manufactured by Ube Industries Ltd. is shown in FIG. 6A. FIG. 6B is a schematic view showing hydroxy groups present on the surface of the support substrate 1 formed of non-alkali glass. The interface between the support substrate 1 and the adhesive layer 2 which is obtained when the adhesive layer 2 is formed on the support substrate 1 is shown in FIG. 7A. As shown in FIG. 7A, hydrogen bonds H1 are each formed between the carbonyl group of the adhesive layer 2 and the hydroxy group of the support substrate 1. By those hydrogen bonds H1, the adhesive layer 2 is adhered to the support substrate 1.

Figure 7B:
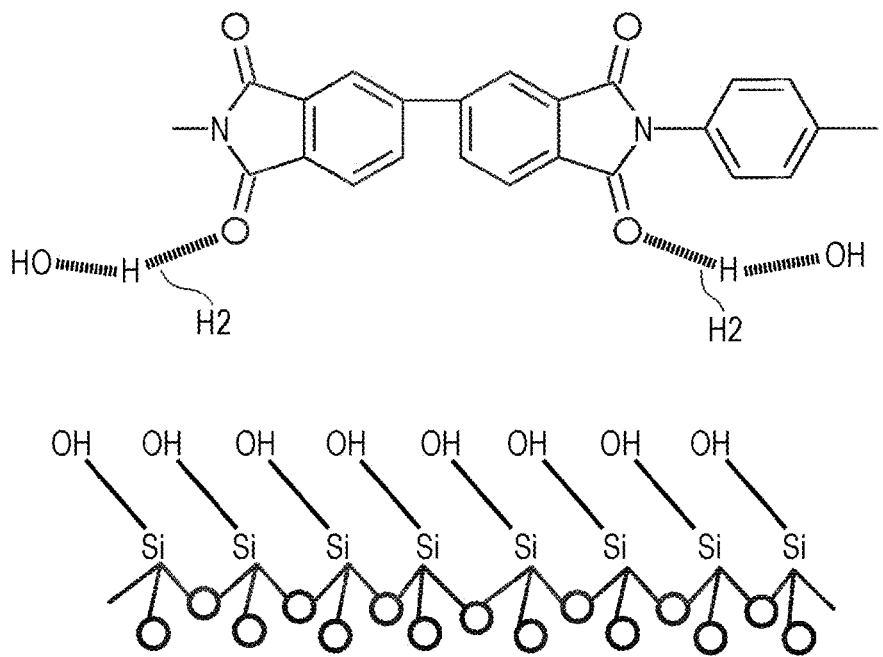
FIG. 7B is a schematic chemical structure showing the state in which the adhesive layer and the support substrate are separated from each other.

In addition, the interface between the support substrate 1 and the adhesive layer 2 obtained after moisture is brought into contact therewith is shown in FIG. 7B. Since the adhesive layer 2 has water absorbability, water molecules permeate between the support substrate 1 and the adhesive layer 2. Accordingly, as shown in FIG. 7B, hydrogen bonds H2 are preferentially formed between the adhesive layer 2 and the water molecules. As a result, the hydrogen bonds H1 are dissociated. Hence, the hydrogen bonds H1 between the adhesive layer 2 and the support substrate 1 disappear, and the adhesive layer 2 which is in contact with moisture is easily separated from the support substrate 1.

Figure 8A:
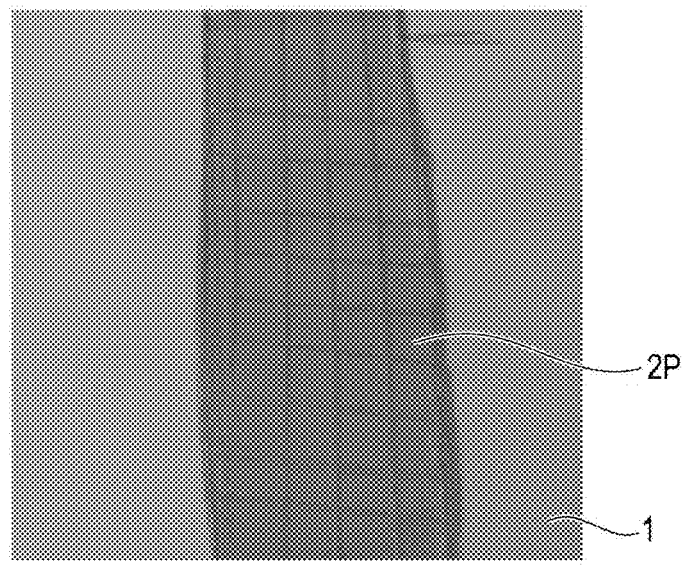
FIG. 8A is an external view showing the state in which the adhesive layer is only formed on the support substrate and is then cross-cut.
Figure 8B:
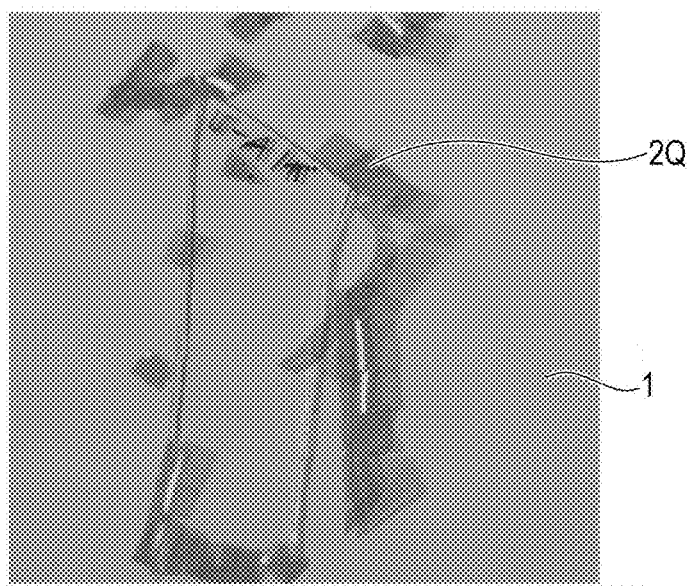
FIG. 8B is an external view showing the state obtained after the adhesive layer which is formed on the support substrate and then cross-cut is left in an atmosphere at a humidity of 90%.

Experimental results obtained by using the support substrate 1 and the adhesive layer 2 are shown. FIG. 8A is a photo taken from the above of the support substrate 1 and showing the state in which a polyimide resin material 2P formed from Upilex A (a descriptive name) sold under the trademark UPILEX, which is manufactured by Ube Industries Ltd., is applied on the support substrate 1 formed of non-alkali glass and is then cross-cut with approximately 5-mm intervals. FIG. 8B is a photo showing the state after the above support substrate 1 shown in FIG. 8A is left in an atmosphere at a humidity of 80% or more. It is found that the polyimide resin material 2P adhered to the support substrate 1 shown in FIG. 8A is peeled away from the support substrate 1 as shown in FIG. 8B and is scattered in the form of polyimide resin material pieces 2Q. The reason for this is that since a warp is generated by a film stress caused during the polyimide resin material 2P formation, when being peeled away from the support substrate 1, the polyimide resin material 2P is scattered in the form of the polyimide resin pieces 2Q. In addition, when the support substrate 1 shown in FIG. 8A is immersed in water and waved, the polyimide resin material 2P is also scattered in the form of the polyimide resin pieces 2Q by buoyancy besides the warp generation.

In addition, as long as the support substrate 1 has hydroxy groups on the surface thereof, the material is not limited to the non-alkali glass described above. In addition, as the material of the adhesive layer 2, as described in the above example, there may be used a material which has a water absorption rate as described above and many functional groups forming hydrogen bonds with the hydroxy groups on the surface of the support substrate 1, and as the functional groups described above, for example, functional groups each having an oxygen atom or a nitrogen atom at the terminal may be mentioned.

3. Conclusion

By the manufacturing method described above, in the step of forming an electronic element, the support substrate and the resin substrate can be tightly held, and after the electronic element is formed, the resin substrate can be easily peeled away from the support substrate. In particular, since the laminate structure and the first sealing layer are collectively cut out, the step of exposing the peripheral surface of the adhesive layer and the step of forming an electronic device can be simultaneously performed. In addition, since the cutting is performed at an outer side of the peripheral surface of the second sealing layer and at an inner side of the peripheral surface of the adhesive layer so as to expose the surface of the support substrate, the state in which the electronic element is covered with the first sealing layer and the second sealing layer is maintained, and even if moisture is brought into contact with the adhesive layer, the electronic element is not in contact with moisture, so that the electronic element can be prevented from being degraded.

In addition, as a method to bring moisture into contact with the adhesive layer, when the electronic device on the support substrate is placed in a high-humidity atmosphere, the electronic device is not required to be in direct contact with liquid water, and hence, a trouble in that the surface of the electronic device is contaminated by adhesion of water droplets can be prevented.

Embodiment 2

In the embodiment 1, the case in which one electronic element 5 is formed on one resin layer 3 has been described.

In this embodiment, the case in which a plurality of electronic elements 5 is formed on one resin layer 3 will be described. In addition, the same constituent element as that described above is designated by the same reference numeral, and description thereof will be omitted.

Figure 9A:
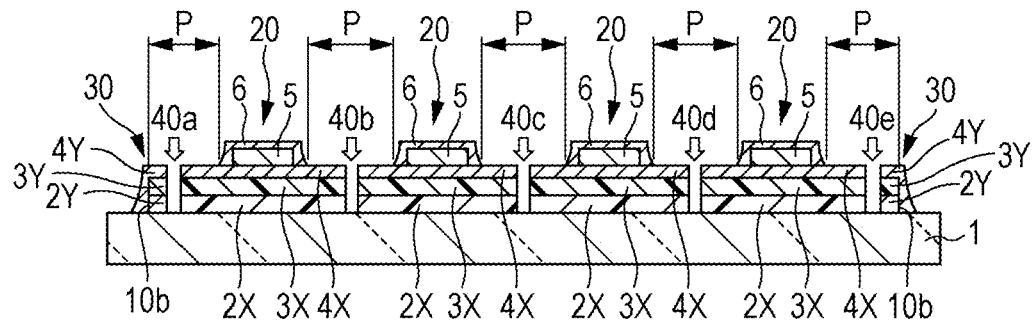
FIG. 9A is a cross-sectional view showing electronic devices on a support substrate according to an embodiment 2.
Figure 9B:
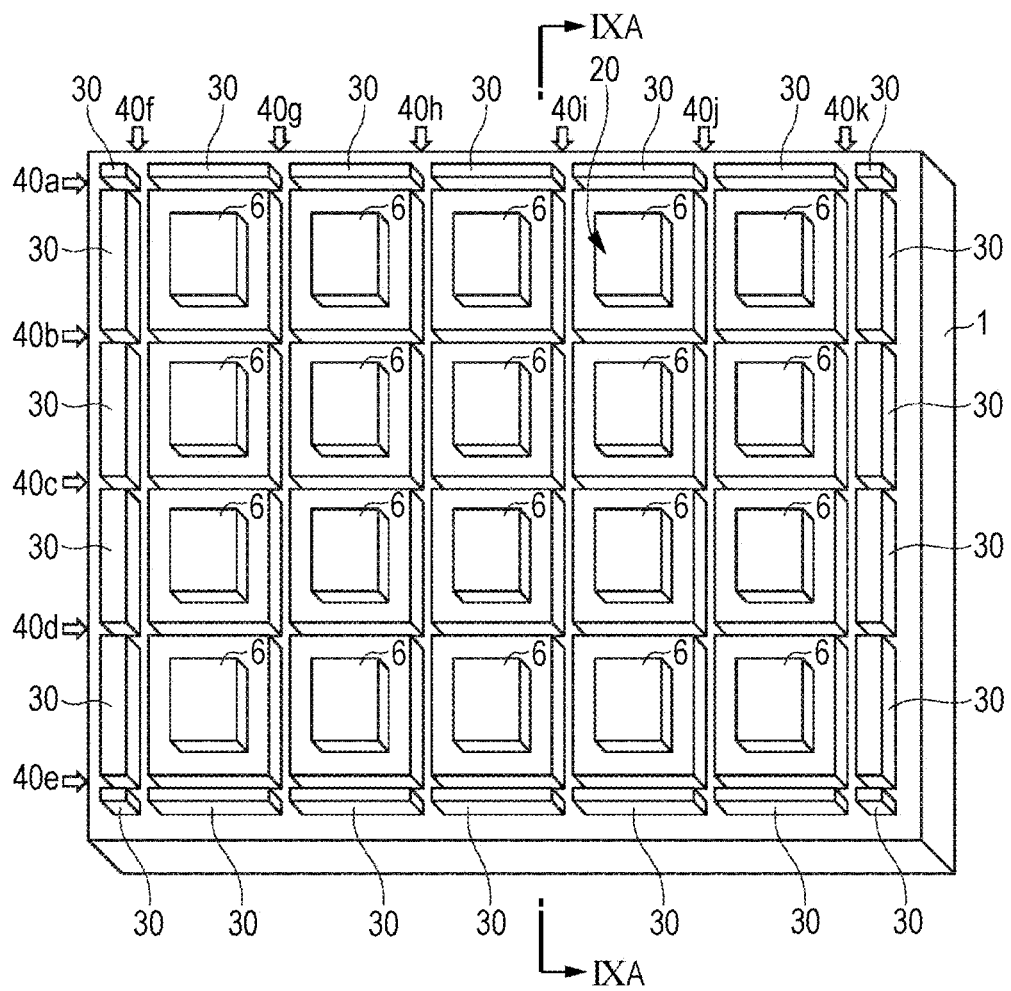
FIG. 9B is an external view showing the electronic devices on the support substrate according to the embodiment 2.

FIG. 9B shows the state in which after sets each including the second sealing layer 6 and the electronic element 5 are arranged in a 4×5 matrix on the first sealing layer 4, cutting is performed. FIG. 9A is a cross-sectional view taken along the line IXA-IXA of FIG. 9B. In this embodiment, the region P includes not only regions each located between the peripheral surface of the adhesive layer 2 and the second sealing layer 6 but also regions between adjacent second sealing layers 6. The reason for this is that also in the regions each located between adjacent second sealing layers 6, the structure in which the support substrate 1, the adhesive layer 2, the resin layer 3, and the first sealing layer 4 are laminated in this order is formed, and no electronic elements 5 nor second sealing layers 6 are provided.

As shown in FIG. 9B, areas 40b to 40d and 40g to 40j between the adjacent second sealing layers 6 and areas 40a, 40e, 40f, and 40k located at an outer side of the group of the second sealing layers 6 formed in the matrix and at an inner side of the peripheral surface 10b of the laminate structure 10 are cut out. By the cutting as described above, as shown in FIG. 9A, between the electronic devices 20 and between the electronic devices 20 and the substrate end portions 30, the adhesive layers 2X are exposed. Hence, when the electronic devices 20 are placed in a high-humidity atmosphere, the adhesion forces each between the adhesive layer 2X and the support substrate 1 is decreased, and as a result, the electronic devices 20 can only be peeled away.

Figure 10:
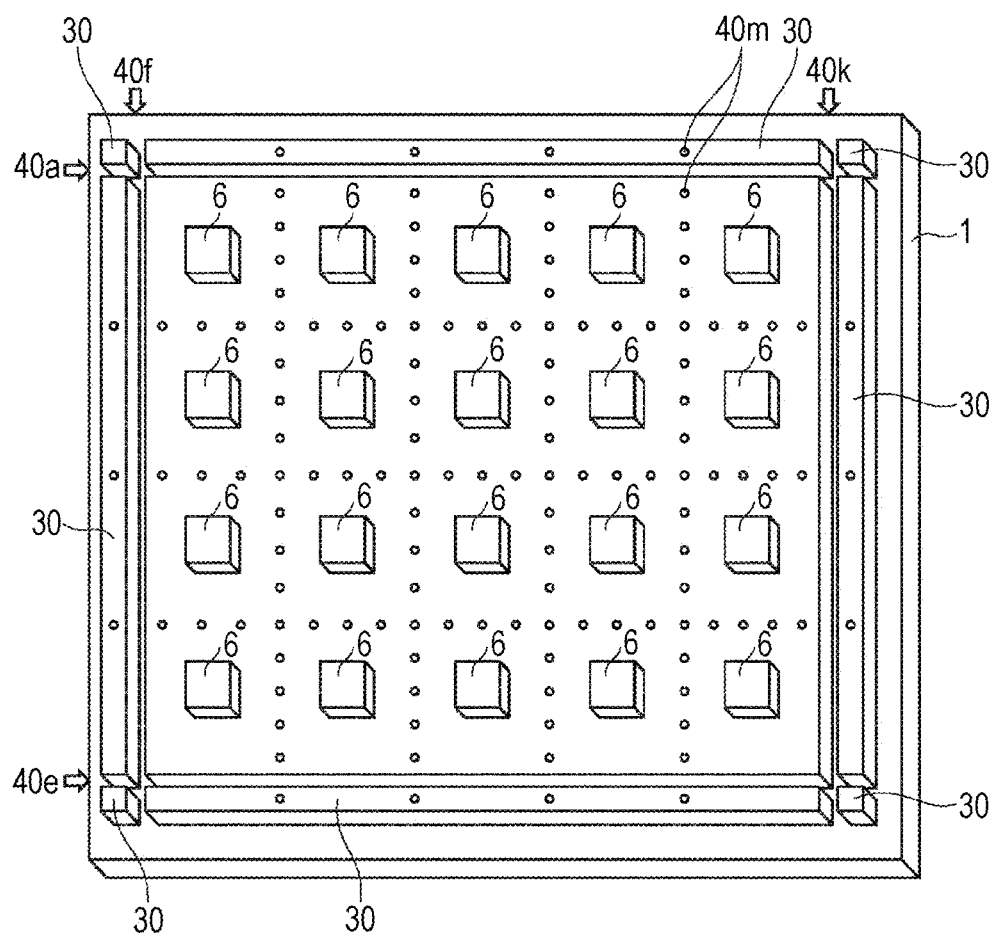
FIG. 10 is an external view showing electronic devices on a support substrate according to a modified example of the embodiment 2.

In addition, as shown in FIG. 10, the areas 40b to 40d and 40g to 40j between the adjacent second sealing layers 6 are not cut out, but a plurality of sewing machine-like holes 40m may be formed in the first sealing layer 4 and the laminate structure 10. By the hole formation as described above, since adhesive layers 2X facing the spaces each between the electronic device 20 and the substrate end portion 30 and facing the holes 40m are in contact with moisture, the adhesion forces each between the adhesive layer 2X and the support substrate 1 is decreased. Hence, a sheet on which the electronic devices 20 are formed in a 4×5 matrix and in which the sewing machine-like holes are formed can be peeled away from the support substrate 1.

Although the display panel device and the manufacturing method thereof according to the present disclosure have been described with reference to the embodiments, the present disclosure is not limited to the above embodiments.

In addition, the use of the display device having a distinct display region as shown in the embodiments is not limited to a specific device, such as a wrist watch-type display device, and may be widely applied to various fields.

In addition, the present disclosure may also include aspects obtained by various modifications of the embodiments by a person skilled in the art and aspects realized by arbitral combination between the constituent elements and functions of the embodiments without departing from the scope of the present disclosure.

Other Modification Examples of Embodiments (1) In the embodiments 1 and 2, although the first sealing layer 4 and the laminate structure 10 are collectively cut out by a cutter in Step S7, the present disclosure is not necessarily limited to this case. The cutting method may be performed either by a physical technique using a cutter or the like or by a chemical technique using etching or the like. In addition, the cutting depth required when the adhesive layer 2 is exposed is not limited to the case in which the first sealing layer 4, the resin layer 3, and the adhesive layer 2 are completely cut out, and as long as the first sealing layer 4 and the resin layer 3 are completely cut out, a part or the whole of the adhesive layer 2 may not be completely cut out. In addition, the support substrate 1 may be partially ground away instead of cutting the first sealing layer 4, or if the support substrate 1 is formed of a fragile material, such as a glass, cracks may be formed therein. When at least a part of the sealing structure, such as the first sealing layer 4 and the support substrate 1, covering the entire adhesive layer 2 is removed, moisture can be supplied to the adhesive layer 2, and hence the present disclosure can be carried out.

(2) In the embodiments 1 and 2, although the peripheral boarder of the second sealing layer 6 is placed at an inner side of the cutting positions in Step S7, the present disclosure is not necessarily limited to this case. For example, when the second sealing layer 6 and the first sealing layer 4 are sufficiently adhered to each other at the inner side of the cutting positions in Step S7, moisture is not likely to permeate the electronic element 5 even after the cutting. Hence, when the electronic element 5 is not likely to be degraded in Step S8, the second sealing layer 6 may be formed to extend to an outer side of the cutting positions in Step S7, and in Step S7, the first sealing layer 4 and the second sealing layer 6 provided thereon may be collectively cut out.

(3) In the embodiments 1 and 2, although the first sealing layer 4 is formed so as to cover the entire upper surface of the resin layer 3, the present disclosure is not necessarily limited to this case. For example, when the water permeability of the resin layer 3 is low, and when the probability in which moisture passing through the resin layer 3 is brought into contact with the adhesive layer 2 is significantly low in the step of forming an electronic element, the first sealing layer 4 may be formed so as to be adhered to the peripheral boarder of the resin layer 3, to cover the peripheral surface of the adhesive layer 2, and to be adhered to the support substrate 1. By the structure as described above, while the area of the first sealing layer 4 is minimized, the adhesive layer 2 can be prevented from being in contact with moisture until the first sealing layer 4 is partially removed.

(4) In the embodiments 1 and 2, although the first sealing layer 4 is formed on the resin layer 3, the present disclosure is not necessarily limited to this case. For example, when the probability in which moisture passing through the resin layer 3 is brought into contact with the adhesive layer 2 is significantly low in Step S5 since the water permeability of the resin layer 3 is low, and when the probability in which the electronic element 5 is degraded by moisture passing through the resin layer 3 is significantly low in Step S7, the first sealing layer 4 may be formed between the resin layer 3 and the adhesive layer 2.

(5) In the embodiments 1 and 2, although the adhesive layer 2 is directly formed on the upper surface 1a of the support substrate 1, the present disclosure is not necessarily limited to this case. For example, on the upper surface 1a of the support substrate 1, one layer improving the adhesion to the adhesive layer may also be provided. As the layer improving the adhesion, for example, a silicon oxide film may be used.

(6) In the embodiment 1, although as the material of the second sealing layer 6, an inorganic material, such as silicon nitride, is used, the present disclosure is not necessarily limited to this case. For example, when the electronic element 5 is a device which emits light not to a second sealing layer side or is not an optical device, as is the first sealing layer 4, the second sealing layer 6 may be formed of a moisture absorber-containing resin in which a chemical absorber, such as calcium oxide, or a physical absorber, such as zeolite, is dispersed in a resin material or may be formed to have a multilayer structure in which an inorganic material and the above moisture absorber-containing resin are laminated to each other.

(7) In the embodiments 1 and 2, although the physical structure of the resin layer 3 is not limited, the resin layer 3 may be a porous layer having many pores therein. In this case, the pore indicates that the inside space thereof is not fully filled with a liquid or a solid, and a gas, such as air or a solvent vapor, is present therein. In addition, in the inside space, besides the gas, a solid foreign substance, such as dust, may also be allowed to be present. However, even in this case, at least 50 percent by volume of the inside space is preferably filled with a gas. In addition, the term "pore" is not limited to a cell-like shape having a completely closed internal space but is used as the concept which also includes a shape in which a wall defining a cell is partially defective, a shape in which a defective wall portion is exposed to the outside of the layer, and a shape in which cells are connected to each other so that the internal spaces thereof are communicated with each other. By the pores as described above, when the side surface of the resin substrate 3X is exposed by partially removing the first sealing layer 4, the adhesive layer 2X can be more efficiently in contact with moisture. The reason for this is that moisture reaches the interface between the resin substrate 3X and the adhesive layer 2X from the side surface of the resin substrate 3X through the pores therein.

(8) In the embodiments 1 and 2, although the first sealing layer 4 and the laminate structure 10 are cut out in Step S7, the present disclosure is not necessarily limited to this case. For example, as long as the first sealing layer 4 and the resin layer 3 are completely cut out, a part or the whole of the adhesive layer 2 may not be completely cut out. In addition, when the resin layer 3 is a porous layer as described above, the first sealing layer 4 may only be completely cut out. In addition, the method to expose the adhesive layer 2 is not limited to the cutting, and a method for forming holes may also be used. Furthermore, the positions to be exposed are not limited to the cutting positions or positions to be cut out, and for example, the second portion 4b of the first sealing layer 4 or the lower end 4c of the second portion 4b may be partially or entirely removed. As described above, when the adhesive layer 2 is directly or indirectly exposed so as to be in contact with moisture, the present disclosure can be carried out. In this case, the indirect exposure indicates the state in which a layer through which moisture is allowed to pass, such as a porous resin layer 3, is in contact with the adhesive layer 2 and is also exposed, and moisture can be brought into contact with the adhesive layer 2 through the layer described above.

(9) In the embodiments 1 and 2, although the cutting is performed so that the second portion 4b of the first sealing layer 4 and the lower end 4c thereof remain in the substrate end portion 30 and not in the electronic device 20, the present disclosure is not necessarily limited to this case. For example, in the cutting positions of the embodiment 1 or in the areas 40a, 40e, 40f, and 40k of the embodiment 2 located at an inner side of the peripheral surface 10b of the laminate structure 10, sewing machine-like holes 40m may be provided. Since the lower end 4c of the second portion 4b of the first sealing layer 4 can be easily destroyed without causing damage on the electronic device 20, when moisture is brought into contact with the adhesive layer 2 through the holes 40m, the entire laminate structure 10 can be peeled away from the support substrate 1.

The electronic device realized by the present disclosure can be applied, for example, to mobile terminals, such as a television, a tablet, and a smart phone, or displays having excellent designability which can be fitted to curved surfaces of vehicle interior appointments and housing appliances.

What is claimed is:

1. A method for manufacturing an electronic device, the method comprising:

fixing a resin substrate to a support substrate with an adhesive layer interposed therebetween to form a laminate structure including the adhesive layer and the resin substrate;

forming a sealing layer that seals at least a portion of the laminate structure at which the adhesive layer is exposed to form a sealing structure including the sealing layer and the support substrate;

forming an electronic element above the resin substrate to form the electronic device including the electronic element and the resin substrate;

exposing the adhesive layer by removing a part of the sealing structure;

supplying moisture to the adhesive layer; and peeling the electronic device from the support substrate, wherein the adhesive layer contains as a primary component, a material which decreases an adhesion force thereof to the support substrate when absorbing moisture.

2. The method for manufacturing an electronic device according to claim 1, wherein the part of the sealing structure which is removed includes a part of the adhesive layer located around the electronic element and a part of the resin substrate located around the electronic element.

3. The method for manufacturing an electronic device according to claim 1, wherein a surface of the support substrate includes a hydroxy group, and the material of the adhesive layer has a high water absorption rate as compared to that of a material of the resin substrate.

4. The method for manufacturing an electronic device according to claim 3, wherein the support substrate is a glass substrate.

5. The method for manufacturing an electronic device according to claim 1, wherein the material of the adhesive layer satisfies in accordance with an ASTM D570 test method, at least one selected from the group of a water absorption rate of 1.5% or more by water immersion at 23° C. for 24 hours and a water absorption rate of 1% or more in an equilibrium state at 50° C. and a relative humidity of 60%.

6. The method for manufacturing an electronic device according to claim 5, wherein the adhesive layer contains as the primary component, a polyimide or a poly(imide amide).

7. The method for manufacturing an electronic device according to claim 1, the method further comprising:

after the electronic element is formed and before the part of the sealing structure is removed, forming an element covering layer which covers an upper surface and a peripheral surface of the electronic element and which is adhered to the sealing layer so as to be present at an inner side of the adhesive layer when viewed in plan, wherein the sealing layer is formed so as to cover the resin substrate, the electronic element is formed on the sealing layer, and the part of the sealing structure which is removed includes a portion of the sealing layer present at an outer side of the element covering layer and at the inner side of the adhesive layer when viewed in plan.

8. The method for manufacturing an electronic device according to claim 1, the method further comprising:

after the electronic element is formed and before the part of the sealing structure is removed, forming an element covering layer which covers an upper surface and a peripheral surface of the electronic element and which is adhered to the sealing layer so as to be present at an inner side of the adhesive layer when viewed in plan; and removing a portion of the element covering layer present on the portion of the sealing layer which is removed, wherein the sealing layer is formed so as to cover the resin substrate, the electronic element is formed on the sealing layer, and the part of the sealing structure which is removed includes a portion of the sealing layer present at an outer side of the electron element and at the inner side of the adhesive layer when viewed in plan.

9. The method for manufacturing an electronic device according to claim 1, wherein the resin substrate is a porous substrate including a plurality of pores therein, the sealing layer is formed so as to cover the resin substrate, and the part of the sealing structure which is removed includes a part of the sealing layer covering the resin substrate.

10. The method for manufacturing an electronic device according to claim 1, wherein the adhesive layer extends in a peripheral direction of the support substrate from the electronic element, the sealing layer is formed so as to cover the resin substrate, and the part of the sealing structure which is removed includes a portion of the sealing layer present at an outer side of the electronic element, the method further comprising: removing a portion of the adhesive layer present under the portion of the sealing layer which is removed.

11. The method for manufacturing an electronic device according to claim 1, wherein a thickness of the adhesive layer is smaller than a thickness of the resin substrate.

12. The method for manufacturing an electronic device according to claim 1, wherein a thickness of the adhesive layer is 5 µm or less.

13. The method for manufacturing an electronic device according to claim 1, wherein by removing the part of the sealing structure, the adhesive layer is partially exposed to moisture supplied to the adhesive layer.

14. The method for manufacturing an electronic device according to claim 1, wherein the electronic element is an organic electroluminescence element comprising two facing electrodes and an organic functional layer which is located between the two facing electrodes and which includes an organic electroluminescence light emitting layer.

15. An electronic device comprising:

a resin substrate including a first surface and a second surface opposite to the first surface;

an adhesive layer arranged on the first surface of the resin substrate;

a sealing layer arranged on the second surface of the resin substrate, and including a third surface in contact with the resin substrate and a fourth surface opposite to the third surface;

an electronic element arranged on the fourth surface of the sealing layer; and an element sealing layer covering the electronic element, wherein the adhesive layer satisfies in accordance with an ASTM D570 test method, at least one selected from the group of a water absorption rate of 1.5% or more by water immersion at 23° C. for 24 hours and a water absorption rate of 1% or more in an equilibrium state at 50° C. and a relative humidity of 60%.

* * * * *